United States Patent [19]

Vitriol et al.

[11] Patent Number: 4,645,552
[45] Date of Patent: Feb. 24, 1987

[54] PROCESS FOR FABRICATING DIMENSIONALLY STABLE INTERCONNECT BOARDS

[75] Inventors: William A. Vitriol, Anaheim; Raymond L. Brown, Riverside, both of Calif.

[73] Assignee: Hughes Aircraft Company, Los Angeles, Calif.

[21] Appl. No.: 672,562

[22] Filed: Nov. 19, 1984

[51] Int. Cl.[4] .............................................. B32B 31/26
[52] U.S. Cl. ........................................ 156/89; 29/829; 29/846; 29/851; 29/852
[58] Field of Search ................. 156/89; 29/829, 831, 29/832, 837, 846, 851, 852

[56] References Cited

U.S. PATENT DOCUMENTS

| | | |
|---|---|---|
| 3,040,213 | 6/1962 | Byer et al. . |
| 3,371,001 | 2/1968 | Ettre . |
| 3,423,517 | 1/1969 | Arrhenius . |
| 3,436,819 | 4/1969 | Lunine . |
| 3,506,473 | 4/1970 | Ettre . |
| 3,549,784 | 12/1970 | Hargis . |
| 3,576,668 | 4/1971 | Fenster et al. . |
| 3,655,496 | 4/1972 | Ettre et al. . |
| 3,726,002 | 4/1973 | Greenstein et al. . |
| 3,728,185 | 4/1973 | Gray ..................... 156/89 |
| 3,756,891 | 9/1973 | Ryan . |
| 3,838,204 | 9/1974 | Ahn et al. . |
| 3,852,877 | 12/1974 | Ahn et al. . |
| 3,948,706 | 4/1976 | Schmeckenbecher et al. . |
| 3,978,248 | 8/1976 | Usami . |
| 4,030,190 | 6/1977 | Varker . |
| 4,109,377 | 8/1978 | Blazick et al. . |
| 4,153,491 | 5/1979 | Swiss et al. . |
| 4,289,719 | 9/1981 | McIntosh et al. . |
| 4,299,873 | 11/1981 | Ogihara et al. . |
| 4,313,262 | 2/1982 | Barnes et al. . |
| 4,336,088 | 6/1982 | Hetherington et al. . |
| 4,397,800 | 8/1983 | Suzuki et al. . |
| 4,406,722 | 9/1983 | Chow et al. . |
| 4,413,061 | 11/1983 | Kumar et al. . |
| 4,434,134 | 2/1984 | Darrow et al. . |
| 4,457,950 | 7/1984 | Fujita et al. . |
| 4,504,339 | 3/1985 | Kamehara et al. ................. 156/89 |

FOREIGN PATENT DOCUMENTS

| | | |
|---|---|---|
| 0006810 | 1/1980 | European Pat. Off. . |
| 0043955 | 1/1982 | European Pat. Off. . |
| 0057085 | 8/1982 | European Pat. Off. . |
| 0062763 | 9/1982 | European Pat. Off. . |
| 0098067 | 1/1984 | European Pat. Off. . |
| 2301277 | 8/1973 | Fed. Rep. of Germany ........ 29/851 |

*Primary Examiner*—Caleb Weston
*Attorney, Agent, or Firm*—K. W. Float; A. W. Karambelas

[57] ABSTRACT

We disclose a process for manufacturing multilayer circuit boards which includes providing a conductive, or an insulating substrate with a conductive pattern thereon, and then transferring and firing a glass-ceramic tape layer to the surface of the substrate. This tape layer provides both electrical isolation between the substrate and electrical conductors or electronic components which are subsequently bonded to or mounted on the top surface of the glass-ceramic tape layer. By providing vertical electrical conductors by means of vias in the tape layer prior to firing the tape layer directly on the substrate, good X and Y lateral dimensionally stability of the tape material is maintained. In addition, a high quality thick film glass-ceramic electrical interconnect structure is achieved at a relatively low manufacturing cost.

25 Claims, 6 Drawing Figures

PROCESS FOR FABRICATING DIMENSIONALLY STABLE INTERCONNECT BOARDS

BACKGROUND OF THE INVENTION

1. Field of the Invention

This invention relates generally to the fabrication of multilayer thick film interconnect circuit boards, and more particularly to a novel process for achieving improved electrical isolation and dimensional stability in these circuits and circuits produced by this process.

2. Related Art

An interconnect circuit board is generally defined as the physical realization of electronic circuits or subsystems from a number of extremely small circuit elements electrically and mechanically interconnected on a substrate. Thick film circuits are fabricated by screen printing and firing conductive, resistive and insulating components onto a ceramic substrate to which active devices are then attached. It is frequently desirable to combine these diverse type electronic components in an arrangement so that they may be physically isolated and mounted adjacent one another in a single package and electrically connected to each other and/or to common connections extending from the package. These common connections may, for example, consist of predefined conductive patterns deposited on a common substrate, where the substrate also serves as a common supporting member for all electronic components and interconnections in the package. Thus, it also frequently becomes necessary to provide a medium for electrically isolating adjacent portions of the conductive pattern or patterns on the substrate from one another as well as isolating these patterns from the electronic components mounted above the substrate.

These components may, for example, be integrated circuits, discrete semiconductor devices, and other passive components such as resistors and capacitors.

A conventional approach to providing this above-described electrical isolation is to use some insulating medium to surround and electrically isolate the conductive pattern on the substrate and also to support and electrically isolate the above-substrate electronic components. One method for achieving such electrical isolation is the so-called thick film process wherein individual conductor and dielectric compositions in paste form are sequentially deposited on insulating substrates and then fired, one layer of material at a time, in order to build up a thick film, multilayer circuit. A common method for depositing these thick film pastes involves the use of a screen printing process for depositing layers of a dielectric paste on the substrate surface and over any conductive patterns thereon and then sequentially firing the layers at a predetermined elevated temperature in order to build up a "thick film" of a preferred thickness.

This prior art thick film process has been employed to maintain good fixed registration (position accuracy) and dimensional stability of the film in the x and y lateral directions as a result of being fired directly on the substrate and thus being positionally secured and permanently referenced to the substrate. However, a disadvantage of this thick film process is that voids can be formed in the thick film dielectric material during the sequential printing and firing process. As a consequence, these voids often produce undesirable holes, cavities or other structural nonuniformities in the completed dielectric thick film layer that can result in shorting between the conductor layers of the circuit. Additionally, when vias are created in the thick film dielectric, flow of dielectric material at the edge of the openings causes the vias to be reduced on site and thus limits the minimum dimension of vias produced by this process.

Another disadvantage of this thick film prior art approach is that the requirement for building up many multiple thick film layers in the more complex hybrid circuits results in an expensive process due to the number of individual processing steps involved.

A third disadvantage of the thick film prior art approach is that the top bonding conductor traces are typically rough and/or rounded as a result of being printed over numerous levels of conductor and dielectric. This geometry or surface topography can reduce the reliability of secondary interconnections, such as wire bonds, made to the surface so treated.

Another prior art approach to the fabrication of hybrid microcircuits is the cofired ceramic process. This technology utilizes dielectric material formed into sheets which are known in the art as "green tape". These sheets of green tape are then either metallized to make a ground plane, signal plane, bonding plane, or the like, or they are formed with via holes and back filled with metallization to form insulating layers. Individual sheets of this green tape are then stacked on each other, laminated together using a chosen temperature and pressure, and then fired at a desired elevated temperature. When alumina is chosen for the insulating material, tungsten, molybdenum or molymanganese is typically used for metallization, and the part is fired to about 1,600° C. in a $H_2$ reducing atmosphere.

One disadvantage of this cofired ceramic approach is that the dielectric film or tape will undergo shrinkage of as much as 20% in each of the X, Y and Z directions. This shrinkage results in a dimensional uncertainty in the fired part of typically 1%. This type of dimensional instability is unacceptable in the fabrication of many types of hybrid circuits, particularly large complex custom circuits used in tightly toleranced military applications.

SUMMARY OF THE INVENTION

The general purpose of this invention is to provide a new and improved process for fabricating thick film multilayer hybrid circuits of the type generally described above, which eliminates the x and y dimensional instability problem of the above-described cofired ceramic process and, at the same time, eliminates the formation of voids, material flow, and structural nonuniformity problems of the above thick film process. In addition, the new process according to the present invention provides a reduction in fabrication steps relative to that of the prior art thick film process.

To accomplish this purpose, we have discovered and developed a novel process for fabricating interconnection circuitry, which includes providing an insulating substrate with a predefined conductive pattern formed thereon which may be processed by known techniques, i.e., screen printing and firing. In the alternative, the substrate may be made of metal or other non-insulating material, or the like. Thereafter, a pyrolizable dielectric film of a chosen thickness, and including an inorganic filler material and an organic binder material, is processed to form vias therein using known techniques, such as mechanical punching. The dielectric film is then positioned on top of and registered to the substrate surface and over the conductive pattern thereon where it conforms to the geometry of the conductive pattern. This dielectric film is also referred to in this art as "green tape."

This composite structure is then placed in a laminating press where the green tape is "transferred" to the substrate using a chosen temperature, pressure and time. A suitable laminating schedule would be 60° C., 1,000 psi and 5 minutes. Next, the part is placed in a furnace and heated to a predetermined elevated temperature sufficient to drive off the organic binder from the dielectric film and simultaneously fuse the inorganic filler material as a uniform dielectric layer to both the underlying substrate and the conductive pattern thereon. This firing temperature is typically 850° C. to 1,000° C., but can be as low as 500° C. for special applications.

Since the tape adheres to the substrate, there is no fired shrinkage in the X or Y direction. All shrinkage is in the Z direction, as is the case with screen printed and fired thick film paste. Therefore, vias will not move around or close during firing and the tape can be patterned prior to transferring it to the substrate. Vias are then filled with conductor using screen printing techniques, or the like, and fired. The next conductor layer in this vertical interconnect process is then screen printed on the fired tape dielectric and itself fired. This process is repeated until the hybrid circuit is built up to a desired vertical interconnect level and completed.

By replacing a screen printed dielectric layer build-up process with a pre-punched dielectric tape layer, we have retained most, if not all, of the primary advantages of the above thick film process, while gaining many of the advantages of the cofired ceramic process.

The above general purpose and other more specific advantages and novel features of the invention will become more readily apparent in the following description of the accompanying drawing.

DESCRIPTION OF THE PREFERRED EMBODIMENTS

Figure 1:
FIGS. 1-6 illustrate schematically the step-by-step process according to the present invention in which a complete hybrid circuit (FIG. 6) is formed in preparation for a subsequent package encapsulation step (not shown). This later packaging step may be used to encapsulate the hybrid circuit in FIG. 6 and may be selected from one of many encapsulation processes known and available in the art.

Referring now to FIG. 1, there is shown a starting substrate 10 which may be a dielectric material, such as alumina beryllia (BeO), or the like. In the alternative, the substrate may be comprised of a metal such as copper, copper clad invar or stainless steel, or the like. The dielectric substrate 10 contains nominally 96% aluminum oxide, $Al_2O_3$, and the thickness typically varies from 25 to 100 mils.

Figure 2:
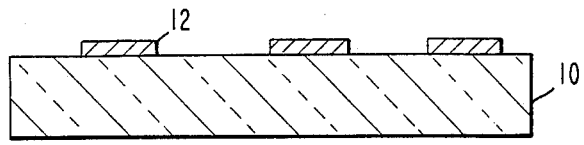

The substrate of FIG. 1 is transferred to a screen printer where a conductive surface pattern, such as gold or copper, is screen printed in a desired geometry, using known screen printing techniques and fired in a furnace at typically 900° C. in order to form the particular conductive pattern 12 shown in FIG. 2.

Figure 3:
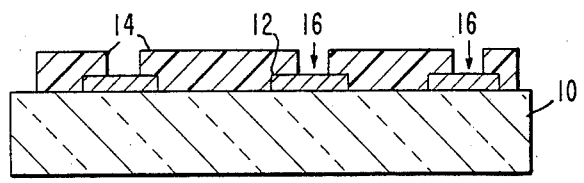

In FIG. 3, a glass-ceramic, dielectric, pliable green tape material 14 of typically 6-8 mils in thickness with vias 16 already formed therein is applied to the upper surface of the structure of FIG. 2. This material is an alumina-filled glass, which is also referred to as a "glass-ceramic". This material will typically incude 40%-60% alumina, $Al_2O_3$, and the "glass" will typically be lead aluminum borosilicate. Presently, this tape is obtained from the E. I. DuPont Company of Wilmington, Del. under the generic names of "green tape" or "ceramic tape," but under no specific trademark or tradename. This green or ceramic tape material is sufficiently pliable so that it adheres and conforms to the exposed top surface of the substrate 10 and the conductive pattern thereon.

Figure 4:
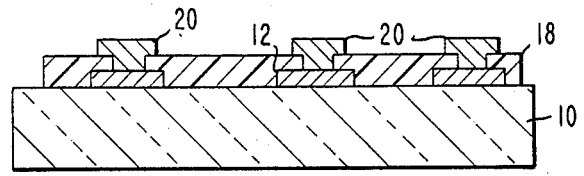

Next, the composite structure of FIG. 3 is heated to a predetermined elevated temperature on the order of 900° C. to drive off the organic binder material in the green tape 14 and thereby leave the sintered dielectric layer 18 as shown in FIG. 4. After firing, the dielectric layer 18 is typically about 2 to 3 mils in thickness.

Figure 5:
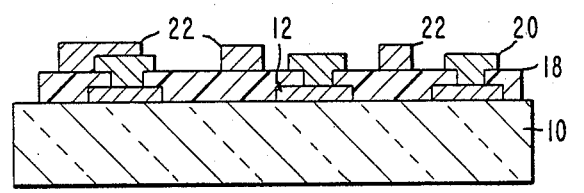

The vias 16 are filled with conductor metallization 20 using known techniques, dried and fired. A second conductive pattern 22 is then printed on the surface of the dielectric layer 18 as shown in FIG. 5, dried and fired. These steps are repeated until the multilayer circuit is completed.

Figure 6:
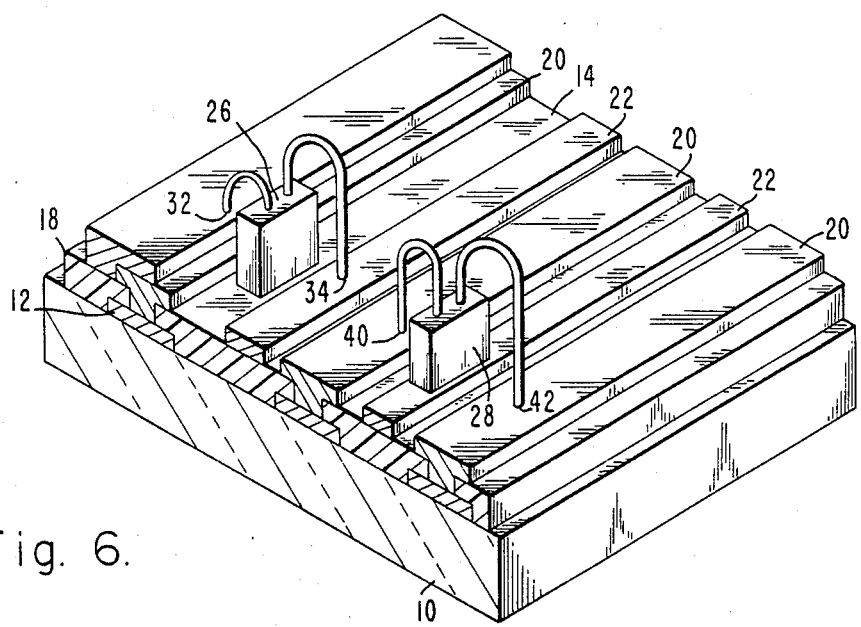

Finally, individual components, such as a transistor or integrated circuit package 26, and passive components 28, such as resistors or capacitors, may be bonded, for example, either directly to the top surface of the fired tape layer 14 in FIG. 6 in the case of the integrated circuit package 26, or to the top of one of the conductive strips 22 thereon in the case of the passive components 28. Then, it may be desirable, for example, to make wire bonds 32, 34 from the transistor or I.C. 26 to the adjacent conductive pattern 22 or to make wire bonds 40, 42 from the passive component 28 to the adjacent metallization 20.

It should be understood, however, that the interconnect structure in FIG. 6 is only intended to show how active or passive components may be die bonded and wire bonded to the upper surface of FIG. 5, and the present invention is intended to cover the process and product of FIG. 5 regardless of how this structure is subsequently processed to include active or passive electronic components thereon prior to further package encapsulation steps.

What is claimed is:

1. A process for fabricating an electrical interconnect board which includes:
    (a) providing a dimensionally stable insulating substrate having a conductive pattern formed thereon;
    (b) forming via holes in a pyrolyzable film that includes an inorganic filler material and an organic binder material;
    (c) transferring said film on top of said conductive pattern and the surrounding insulating substrate surface such that said film is adhered to and dimensionally fixed thereon;
    (d) heating said insulating substrate, said conductive pattern and said pyrolyzable film to a predetermined elevated temperature sufficient to drive off the organic binder material in said film and securely fuse the inorganic filler material contained therein as a uniform dimensionally stable dielectric layer covering said substrate surface and the conductive pattern formed thereon;
    (e) metallizing the top surface of said dimensionally stable dielectric layer with a predetermined metallization pattern; and (f) repeating steps (b) through (e) until the electrical interconnect board is complete.

2. The process defined in claim 1 wherein said insulating substrate contains about 96% alumina, $Al_2O_3$, said inorganic material is a low firing temperature glass ceramic, and said pyrolyzable film is transferred to said insulating substrate using a chosen temperature and pressure to cause said film to adhere to said substrate.

3. The process defined in claims 1 or 2 wherein said substrate is comprised of from 88% to 99.5% alumina.

4. The process defined in claims 1 and 2 wherein said substrate is comprised of beryllium oxide.

5. The process defined in claims 1 or 2 wherein said pyrolyzable film is comprised of aluminum oxide ($Al_2O_3$) and glass.

6. The process defined in claims 1 or 2 wherein said conductive pattern and said insulating layer are fired simultaneously.

7. The process defined in claims 1 or 2 wherein said substrate contains about 96% alumina and said inorganic material is a low firing temperature glass ceramic.

8. A process for fabricating an electrical interconnect board which includes:
  (a) providing a dimensionally stable substrate;
  (b) providing a pyrolyzable film that includes an inorganic filler material and an organic binder material having a predetermined via hole pattern disposed therein;
  (c) metallizing the top surface and via holes of said via hole pattern of said pyrolyzable film with a predetermined metallization pattern;
  (d) transferring said film to one surface of said substrate such that said film adheres to and becomes dimensionally fixed thereon;
  (e) heating said substrate and said pyrolyzable film to a predetermined elevated temperature sufficient to drive off the organic binder material in said film and securely fuse the inorganic filler material contained therein as a uniform dimensionally stable dielectric layer to said one surface of said substrate; and
  (f) repeating steps (b) through (e) until the electrical interconnect board is complete.

9. A process for fabricating an electrical interconnect board which includes:
  (a) providing a dimensionally stable substrate;
  (b) providing a pyrolyzable film that includes an inorganic filler material and an organic binder material having a predetermined via hole pattern disposed therein;
  (c) transferring said film to one surface of said substrate such that said film adheres to and becomes dimensionally fixed thereon;
  (d) heating said substrate and said pyrolyzable film to a predetermined elevated temperature sufficient to drive off the organic binder material in said film and securely fuse the inorganic filler material contained therein as a uniform dimensionally stable dielectric layer to said one surface of said substrate; and
  (e) metallizing the top surface and via holes of said via hole pattern of said dimensionally stable dielectric layer with a predetermined metallization pattern;
  (f) repeating steps (b) through (e) until the electrical interconnect board is complete.

10. A process for fabricating a thick film electrically interconnected structure which includes:
  (a) providing a dimensionally stable insulating substrate having a conductive pattern thereon;
  (b) providing a glass-ceramic tape layer having predefined via holes extending therethrough from one major surface thereof to the other;
  (c) adhering said tape layer to the top surface of said insulating substrate having said conductive pattern thereon;
  (d) firing said tape layer and said insulating substrate at a predetermined elevated temperature to provide a thick film structure having lateral dimensional stability;
  (e) metallizing the top surface of said tape layer with a predetermined metallization pattern; and
  (f) repeating steps (b) through (e) until the thick film electrically interconnected structure is complete.

11. The process defined in claim 10 wherein said substrate is primarily alumina and said tape layer includes from 40% to 60% alumina, a chosen borosilicate glass and an organic binder material which is driven off during firing.

12. The process defined in claim 10 or 11 wherein said tape layer is transferred to said insulating substrate using chosen temperature and pressure to cause said tape layer to adhere to said substrate.

13. The process defined in claims 10 or 11 wherein said substrate is comprised of 88% to 99.5% alumina.

14. The process defined in claims 10 or 11 wherein said substrate is comprised of beryllium oxide.

15. The process defined in claims 10 or 11 wherein said tape layer is comprised of aluminum oxide ($Al_2O_3$) and glass.

16. The process defined in claims 10 or 11 wherein said conductive pattern and said insulating layer are fired simultaneously.

17. A process for fabricating an electrical interconnect board which includes the steps of:
  (a) providing a dimensionally stable insulating substrate;
  (b) applying a first conductive layer to one surface of said substrate;
  (c) heating said substrate and said conductive layer to form a unitary structure
  (d) providing a pyrolyzable film that includes an inorganic filler material and an organic binder material, said film having a predetermined hole pattern therein;
  (e) adhering said pyrolyzable film to one surface of said substrate such that said hole pattern is dimensionally fixed;
  (f) heating said substrate and said pyrolyzable film to a predetermined elevated temperature sufficient to drive off the organic binder material in said film and securely fuse the inorganic filler material contained therein as a uniform dimensionally stable dielectric layer covering said one surface of said substrate;
  (g) filling said hole pattern of said pyrolyzable film with metal;
  (h) heating said substrate, said film and said filled hole pattern to form a unitary structure;
  (i) applying a second conductive layer to the top surface to said filled pyrolyzable film;
  (j) heating said substrate, said film and said second conductive layer to form a unitary structure;
  (k) repeating steps (d) through (j) until said electrical interconnect board is fabricated.

18. A process for fabricating an electrical interconnect board which includes:
 (a) providing a dimensionally stable substrate;
 (b) providing a pyrolyzable film that includes an inorganic filler material and an organic binder material having a predetermined via hole pattern disposed therein;
 (c) transferring said film to one surface of said substrate such that said film adheres to and becomes dimensionally fixed thereon; and
 (d) heating said substrate and said pyrolyzable film to a predetermined elevated temperature sufficient to drive off the organic binder material in said film and securely fuse the inorganic filler material contained therein as a uniform dimensionally stable dielectric layer to said one surface of said substrate;
 (e) metallizing the top surface of said dimensionally stable dielectric layer with a predetermined metallization pattern; and
 (f) repeating steps (b) through (e) until the electrical interconnect board is complete.

19. A process for fabricating an electrical interconnect board which includes the steps of:
 (a) providing a dimensionally stable substrate;
 (b) providing a pyrolyzable film that includes an inorganic filler material and an organic binder material, said film having a predetermined via hole pattern therein;
 (c) adhering said pyrolyzable film to one surface of said substrate such that said hole pattern is dimensionally fixed;
 (d) heating said substrate and said pyrolyzable film to a predetermined elevated temperature sufficient to drive off the organic binder material in said film and securely fuse the inorganic filler material contained therein as a uniform dimensionally stable dielectric layer covering said one surface of said substrate;
 (e) filling said via hole pattern of said pyrolyzable film with metal;
 (f) heating said substrate, said film and said filled hole pattern to form a unitary structure;
 (g) applying a second conductive layer to the top surface to said filled pyrolyzable film;
 (h) heating said substrate, said film and said second conductive layer to form a unitary structure;
 (i) repeating steps (b) through (h) until said electrical interconnect board is fabricated.

20. The process defined in claims 18 or 19 wherein said pyrolyzable film is comprised of aluminum oxide and glass.

21. The process defined in claims 18 or 19 wherein said substrate is comprised of metal.

22. The process defined in claims 18 or 19 wherein said pyrolyzable film is transferred to said substrate using a chosen temperature and pressure to cause said film to adhere thereto.

23. The process defined in claims 18 or 19 wherein said substrate contains about 96% alumina and said inorganic material is a low firing temperature glass ceramic.

24. The process defined in claims 18 or 19 wherein said substrate is comprised of 88% to 99.5% alumina.

25. The process defined in claims 18 or 19 wherein said substrate is comprised of beryllium oxide.

* * * * *